United States Patent [19]
Wozniak et al.

[11] Patent Number: 5,313,152
[45] Date of Patent: May 17, 1994

[54] NETWORK FOR MINIMIZING CURRENT IMBALANCES IN A FARADAIC BATTERY

[75] Inventors: Walter Wozniak, Dearborn; Harold J. Haskins, Ann Arbor, both of Mich.

[73] Assignee: Ford Motor Company, Dearborn, Mich.

[21] Appl. No.: 901,002

[22] Filed: Jun. 19, 1992

[51] Int. Cl.$^5$ .............................................. H02J 7/00
[52] U.S. Cl. ............................................ 320/6; 320/17; 320/43
[58] Field of Search .................. 320/17, 18, 43, 44, 320/48, 6, 15, 13; 307/64, 66; 324/427, 433, 434

[56] References Cited

U.S. PATENT DOCUMENTS

| | | |
|---|---|---|
| 3,487,295 | 12/1969 | Nocera et al. |
| 3,559,047 | 1/1971 | Rousset. |
| 3,925,771 | 12/1975 | Satake ................................. 340/249 |
| 4,079,303 | 3/1978 | Cox ..................................... 320/17 |
| 4,238,721 | 12/1980 | DeLuca et al. ...................... 320/18 |
| 4,258,306 | 3/1981 | Bourke et al. ...................... 320/48 |
| 4,331,911 | 5/1982 | Park ................................. 320/17 X |
| 4,484,140 | 11/1984 | Dieu ................................. 320/43 X |
| 4,502,000 | 2/1985 | Mashikian ............................. 320/6 |
| 4,502,001 | 2/1985 | Galloway .............................. 320/6 |
| 4,595,880 | 6/1986 | Patil .................................. 324/427 |
| 4,719,401 | 1/1988 | Altmeja ............................. 320/6 X |
| 4,816,736 | 3/1989 | Dougherty et al. ................... 320/17 |
| 4,823,086 | 4/1989 | Whitmire et al. ................... 324/434 |
| 4,876,495 | 10/1989 | Palanisamy et al. ................. 320/18 |
| 4,906,055 | 3/1990 | Horiuchi ........................... 307/354 |
| 4,937,528 | 6/1990 | Palanisamy ........................ 324/430 |
| 5,063,340 | 11/1991 | Kalenowsky ........................ 320/18 |
| 5,153,496 | 10/1992 | LaForge ............................ 320/18 |

*Primary Examiner*—Kristine L. Peckman
*Attorney, Agent, or Firm*—Roger L. May; Mark L. Mollon

[57] ABSTRACT

A circuit for connecting a faradaic battery with circuitry for monitoring the condition of the battery includes a plurality of voltage divider networks providing battery voltage monitoring nodes and includes compensating resistors connected with the networks to maintain uniform discharge currents through the cells of the battery. The circuit also provides a reduced common mode voltage requirement for the monitoring circuitry by referencing the divider networks to one-half the battery voltage.

9 Claims, 3 Drawing Sheets

NETWORK FOR MINIMIZING CURRENT IMBALANCES IN A FARADAIC BATTERY

CONTRACTUAL ORIGIN OF THE INVENTION

The invention described herein was made in the course of, or under, a contract with the UNITED STATES DEPARTMENT OF ENERGY.

BACKGROUND OF THE INVENTION

This invention relates generally to electric propulsion vehicles that are powered by faradaic batteries and more particularly to a circuit for interfacing electronic monitoring devices to a faradaic battery to determine the condition or state of health of the battery, i.e., the presence of weak or failed cells, while minimizing imbalances in the current drawn from the various cells of the battery.

Electrically propelled vehicles use electric traction motors operated from a battery system mounted in the vehicle. An accurate indication of the condition of the battery is desirable since the available charge is directly related to the range of the vehicle before a recharge of the battery is necessary. Accordingly, electrically propelled vehicles generally include voltage monitoring devices which are electrically connected with the battery system for detecting and indicating the state of health of the battery.

When recharging the battery, it is desirable to equalize the charge in the individual cells of the battery at a set voltage level. Non-faradaic batteries, such as those comprising a plurality of serially connected lead/acid cells, can be brought into balance by application of a low-rate equalization charge. This results in all cells of the battery reaching a full 100% state-of-charge. However, faradaic battery systems, such as those comprising sodium/sulfur cells, cannot be brought into balance by this method, due to the inability of faradaic battery cells to bypass the equalization charge current once the cell reaches full charge. It is therefore important to maintain uniform discharge currents through the cells of a faradaic battery. This need for discharge uniformity also applies to the small currents required by the voltage measuring networks used to monitor battery condition. Even small systematic imbalances in the cell currents will accumulate and result in significant loss of battery capacity over time.

Conventional circuitry for interfacing the battery with monitoring equipment is either complex or suffers from severe common mode voltage requirements leading to expensive monitoring equipment.

SUMMARY OF THE INVENTION

In accordance with the present invention a plurality of voltage divider networks "n" are connected with a plurality of modules of a faradaic battery. Each module includes a plurality of cells. Each network provides a monitoring point for equipment intended to monitor the condition of the battery. One side of each of the networks is connected to a reference voltage point equal to one-half battery voltage. The monitoring equipment is then referenced to one-half battery voltage to reduce common mode voltage. The other side of each network is connected to respective ones of the modules of the battery and thus provides a means of measuring the voltage at each module to thereby obtain an indication of the condition of the battery cells in any one of the modules. A compensating resistor is associated with "n−1" of the voltage divider networks, and is sized to insure that the current drawn by the networks results in uniform discharge currents through the cells of the battery thus extending battery life.

BRIEF DESCRIPTION OF THE DRAWINGS

Other features and advantages of the invention will be apparent from the following detailed description taken in conjunction with the accompanying drawings in which.

DETAILED DESCRIPTION OF THE INVENTION

Figure 1:
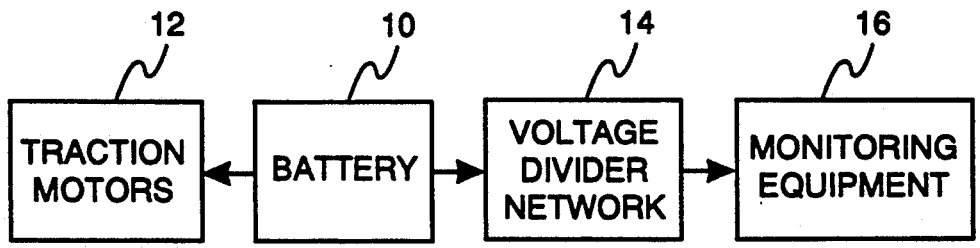
FIG. 1 is a generalized block diagram showing the invention in the environment of an electric vehicle battery monitoring system.

Referring now to the drawings and initially to FIG. 1, a traction battery for an electric vehicle is generally designated 10 and is connected with traction motors generally designated 12 for providing drive current to the motors. The battery 10 is connected via a voltage divider network 14 to monitoring equipment generally designated 16 which monitors the state of health of the battery 10.

Figure 2:
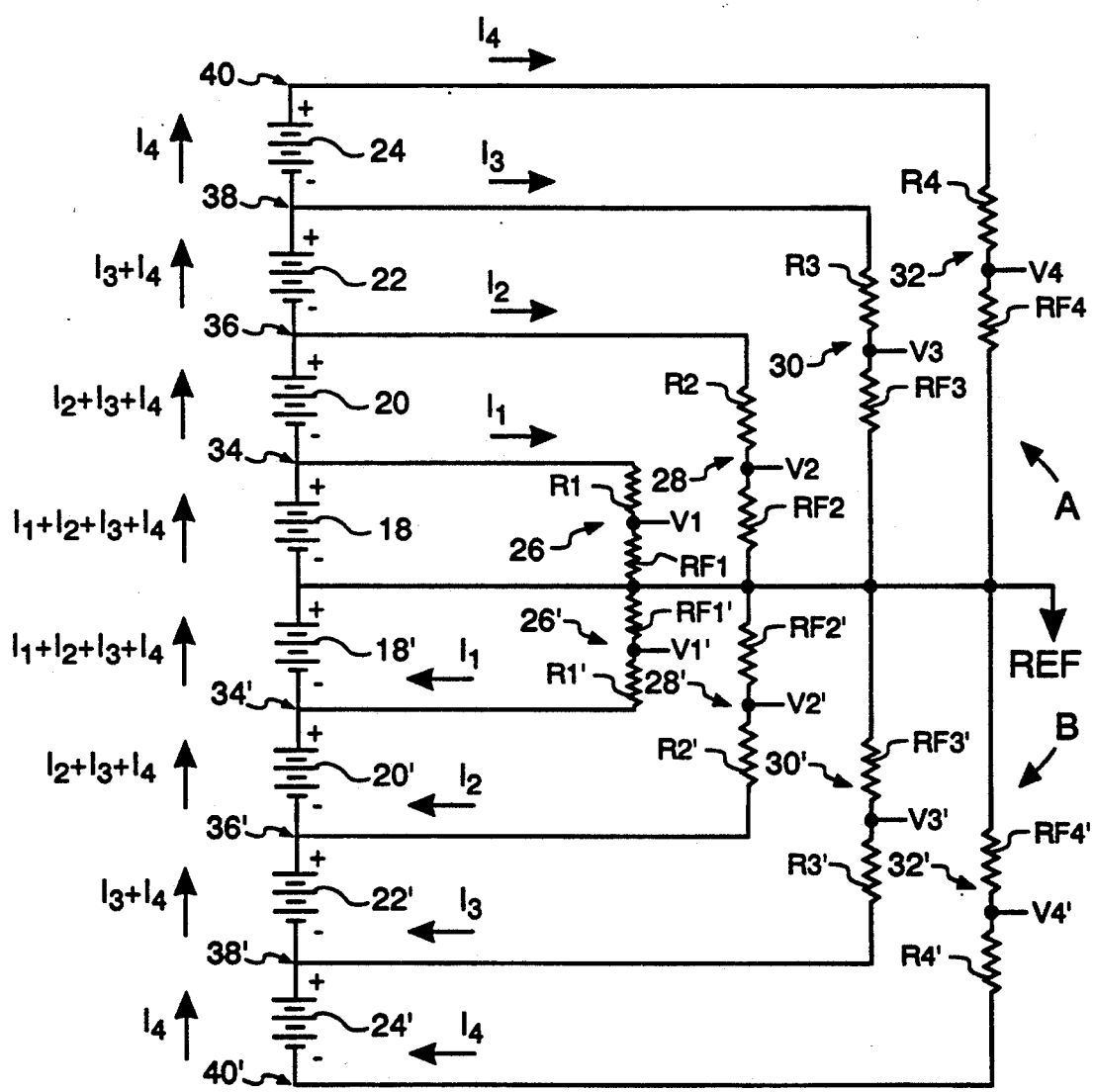
FIG. 2 shows a voltage divider network connected with a battery and providing voltage monitoring signals useful for monitoring the condition of the battery.

Referring to FIG. 2 the battery 10 is shown to comprise two banks of battery modules A and B. The bank A includes modules 18-24 and the bank B includes modules 18'-24'. Each of the modules may include 20 cells for a total of 160 cells. The number of modules shown is merely for the purpose of simplifying the description of the invention. A typical battery for use in an electric vehicle may comprise 32 modules of 5 cells each and provide a total voltage of, for example, 320 volts.

The point intermediate the bank A and B is designated REF and provides a reference voltage of ½ total battery voltage or 160 volts. This point is used as a reference for the monitoring equipment in order to minimize the common mode voltage requirements of the equipment. In order to monitor the status of the cells in the module A, the monitoring equipment is connected with voltage divider networks 26-32 which provide monitoring nodes V1-V4, between resistors R1, RF1; R2, RF2; R3, RF3; and R4, RF4, respectively. Each of the networks 26-32 has one side connected to REF while the other side is connected with progressively higher voltage nodes in bank A designated 34-40. Bank B is the mirror image of Bank A and the components and connections therein are indicated by prime number.

While the circuit configuration of FIG. 2 provides the benefits of reduced common mode voltage for the electronic instrumentation equipment used to monitor battery state of health, unbalanced or unequal discharge currents are created among the battery modules. Note that while the current drawn from the modules 18 and 18' are equal to the sum of the currents $I+I_2+I_3+I_4$, the current through the modules 20 and 20' are reduced by the amount of the current $I_2$ flowing in the network 28 and 28'. Similarly, the currents in modules 22 and 22', 24 and 24' are reduced by the current $I_3$ and $I_4$. While this does not pose a substantial problem with a non-faradaic battery such as lead/acid, these unbalanced discharge currents can, over time, result insignificant loss of battery capacity in a faradaic battery.

Figure 3:
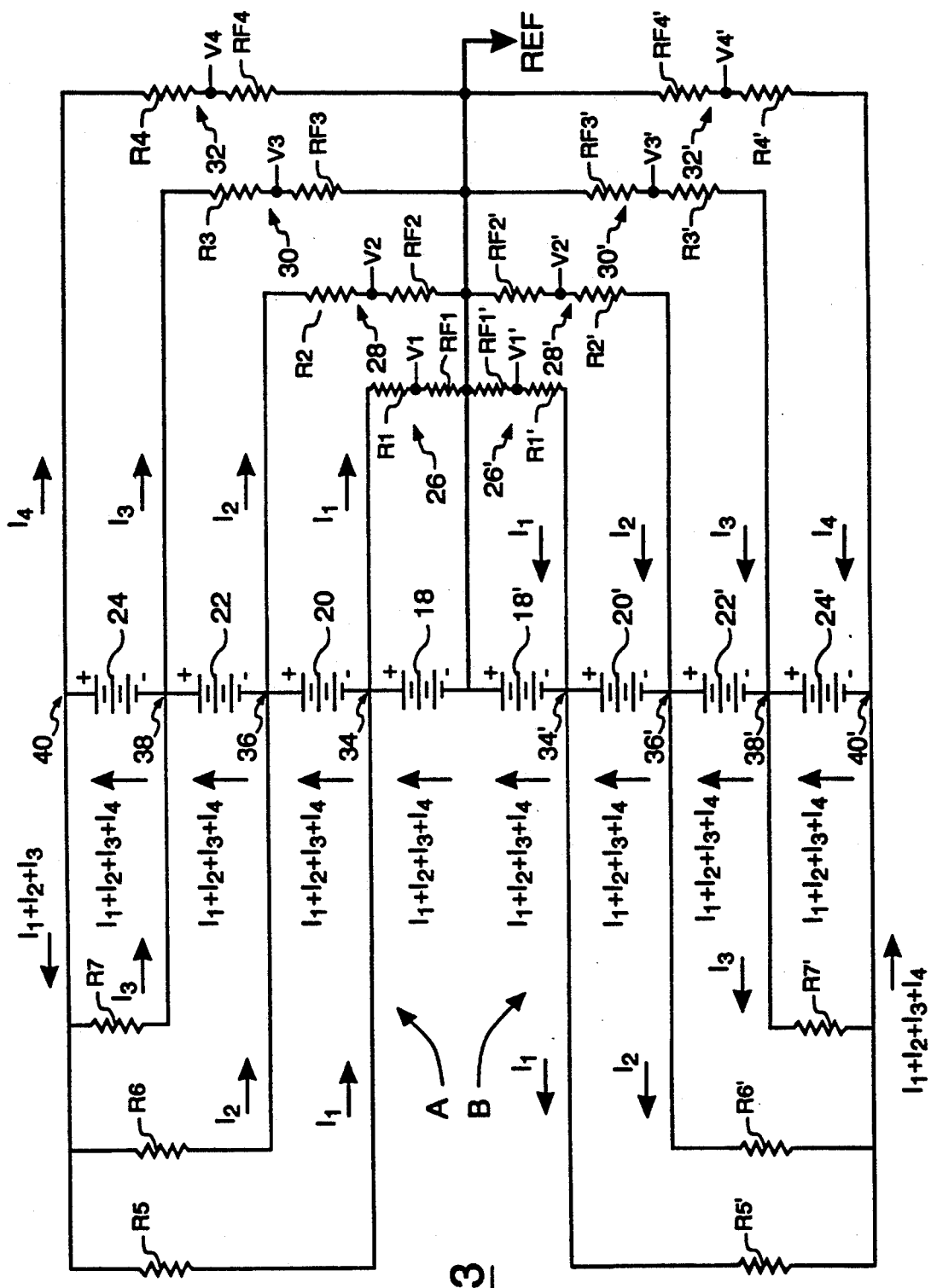
FIG. 3 shows an embodiment of the circuit of the present invention including eight battery modules.

Referring now to FIG. 3, the circuit of FIG. 2 has been modified to solve the problem of discharge current imbalance by the addition of compensating resistors R5, R6 and R7 in bank A and R5', R6' and R7' in Bank B. One side of each of the resistor R5, R6 and R7 is connected with the positive side of module 24 or node 40, while the other side of the resistors R5, R6 and R7 are connected with the positive terminal of the modules 18, 20 and 22 i.e. nodes 34, 36 and 38 respectively. The resistors R5, R6 and R7 are sized to draw a current substantially equal to that drawn by the networks 26, 28 and 30 respectively. Thus, the currents discharged from each of the modules 18, 20, 22, and 24 are equal to the sum of the currents I1, I2, I3 and I4 as indicated. Similarly, the currents discharged from each of the modules 18', 20' and 24' are equal as a result of the addition of the properly sized compensating resistors R5', R6' and R7'.

Figure 4:
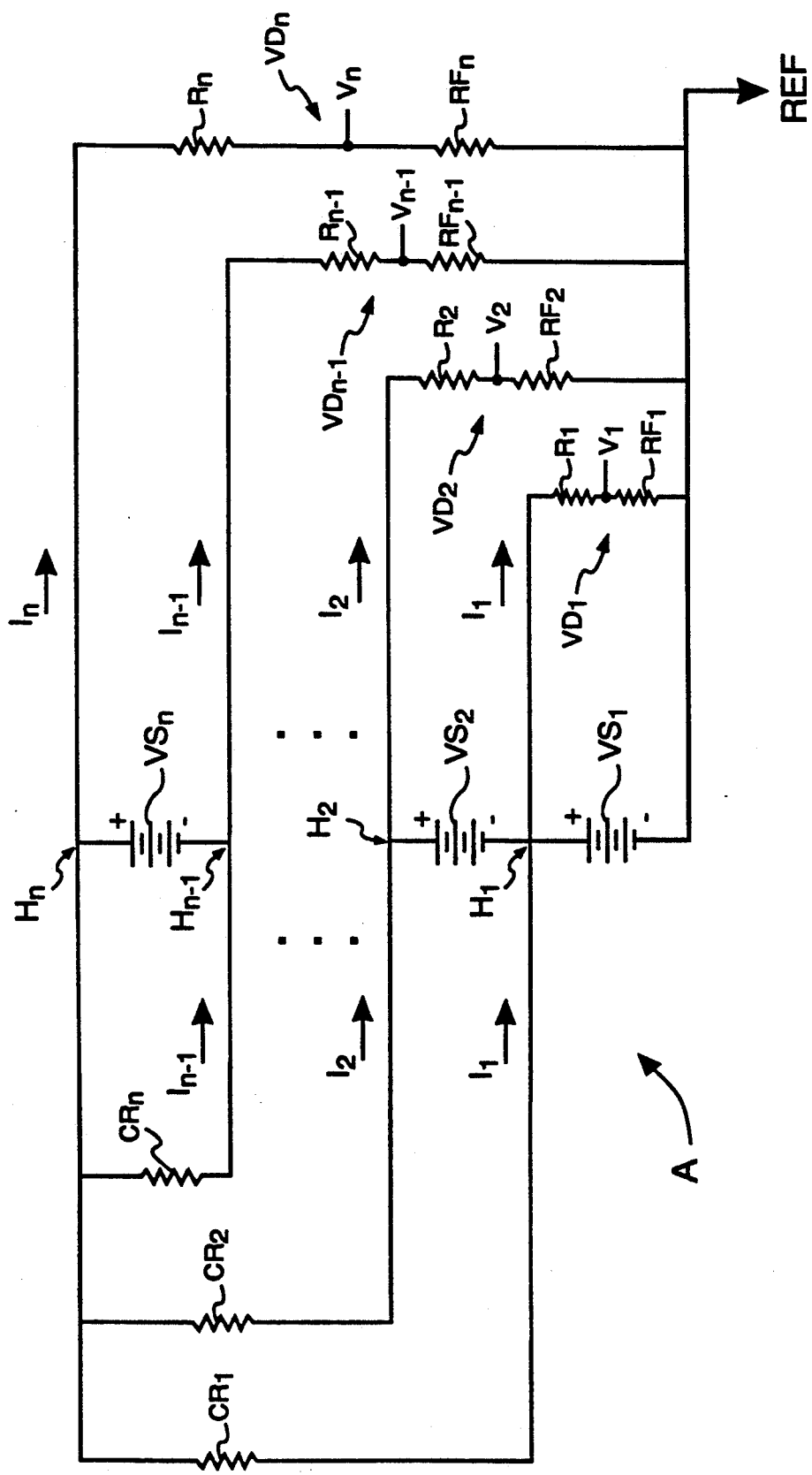
FIG. 4 is a circuit representation of the invention generalized for "n" battery modules.

FIG. 4 show a general case for any number of serially connected modules $VS_1 \ldots VS_n$ in for example the bank A. The divider networks $VD_1 \ldots VD_n$ comprising resistors $R_1 \ldots R_n$ and $RF_1 \ldots RF_n$, provide monitoring junctions $V_1 \ldots V_n$. The networks $VD_1 \ldots VD_n$ are connected between the reference node REF and the nodes $H_1 \ldots H_n$ and draw currents $I_1 \ldots I_n$. The compensating resistors $CR_1 \ldots CR_n$ are connected between the node Hn and the nodes $H_1 \ldots H_{n-1}$ and are sized to draw currents equal to those in the respective divider networks $VD_1 \ldots VD_{n-1}$. In a preferred embodiment of the invention employing 32 modules of 5 cells each, the resistor $RF_1 \ldots RF_n$ are each equal to 10K ohm, while the resistor R1=4K. Where equal currents $I_1 \ldots I_n$ are desired and equal voltages exist across the modules $VS_1 \ldots VS_n$, the value of the resistors $R_2 \ldots R_n$ may be obtained from the equation Ri=iR1+(i−1)RF. For example, R2=2(4)+(2−1)10=18K; R15=15(4)+(15−1)10=200K; and R16=16(4)+(16−1)10=214K. The value of the compensating resistors $CR_1 \ldots CR_n$ may be obtained from the equation $CR_n = R_n - R_{n-1}$. For example, CR15=214−200=14K; and CR1=214−4=200K.

The monitoring equipment generally designated 16 in FIG. 1, is as previously indicated tied to the one-half battery voltage node REF and may take several forms but preferably include a microprocessor which controls a suitable analog multiplexor associated with each of the banks A and B to provide an analog voltage to respective differential amplifiers. After suitable clamping and filtering the outputs of the amplifiers are converted to digital values for processing by the microprocessor in accordance with known algorithms for relating the voltages at the monitoring nodes $V_1 \ldots V_n$ to the state of health of the battery.

While the best mode for carrying out the invention has been described in detail, those familiar with the art to which this inventions relates will recognize alternative designs and embodiments for practicing the invention as defined by the following claims.

We claim:

1. A circuit for connecting a faradaic battery with means for monitoring the condition of the battery, said battery comprising a plurality of serially connected modules ($VS_1 \ldots VS_n$) each having positive and negative terminals, said battery having a reference node establishing a reference voltage at one of the terminals of one of the modules ($VS_1 \ldots VS_n$), said circuit comprising:

a plurality of voltage divider networks ($VD_1 \ldots VD_n$), each including a monitoring node and first and second terminating nodes;

one terminating node of each of said networks being connected to said reference node;

the other terminating node of each of said networks being connected to the other of said terminals of respective ones of said modules ($VS_1 \ldots VS_n$) to draw currents ($I_1 \ldots I_n$) respectively;

compensating network means including resistors ($CR_1 \ldots CR_n$) respectively connecting said other of said terminals of respective ones of said modules ($VS_1 \ldots VS_{n-1}$) to the other of said terminals of the last of said serially connected modules ($VS_n$), the resistors ($CR_1 \ldots CR_n$) being respectively sized to draw currents substantially equal to the respective currents ($I_1 \ldots I_{n-1}$);

whereby the current drawn by the compensating network means of the battery is substantially uniform and equal to the sum of currents flowing in the divider networks ($VD_1 \ldots VD_n$).

2. The circuit of claim 1 wherein the divider networks ($VD_1 \ldots VD_n$) each include a first resistor ($R_1 \ldots R_n$) connected between said monitoring node and said first terminating node and a second resistor ($RF_1 \ldots RF_n$) connected between said monitoring node and said second terminating node.

3. The circuit of claim 2 wherein voltage across each of said modules is substantially equal.

4. The circuit of claim 3 wherein the current drawn by each divider network is substantially equal.

5. The circuit of claim 4 wherein each of said second terminating nodes is connected to said reference node and each of said second resistors ($RF_1 \ldots RF_n$) is of substantially equal resistance value.

6. The circuit of claim 5 wherein the sum of the resistors in the "last" voltage divider network is substantially equal to the sum of the resistors in the respective voltage divider networks ($VD_1 \ldots VD_{n-1}$) added to the compensating resistors ($CR_1 \ldots CR_{n-1}$) respectively.

7. In combination with a faradaic battery and means for monitoring the condition of the battery, said battery comprising a plurality of serially connected modules including at least first, second, third and fourth modules, each having positive and negative terminals, the negative terminal of said first module and the positive terminal of said second module being connected together and to a reference node to establish a reference voltage equal to one-half the total battery voltage, a circuit comprising:

first and second voltage divider networks, connected across said first and second modules respectively, said first network including first and second resistor means, with a first monitoring node therebetween, said second network including third and fourth resistor means, with a second monitoring node therebetween;

a third voltage divider network connected across said first and third serially connected modules, said third network including fifth and sixth resistor means, with a third monitoring node therebetween;

a fourth voltage divider networks connected across said second and fourth serially connected modules, said fourth network including seventh and eighth resistor means, with a fourth monitoring node therebetween;

first and second compensating resistor means connected across said third and fourth modules respectively;

means connecting said first, second, third and fourth monitoring nodes to said monitoring means;

said compensating resistor means and the resistor means in said networks being sized to insure that current drawn by said monitoring means from said first, second, third and fourth modules is substantially equal.

8. The combination comprising:

a faradaic battery comprising a first bank of "n" serially connected modules each having positive and negative terminals, n being an integer greater than one;

monitoring means for monitoring the condition of said battery;

"n" voltage divider networks each including a first monitoring node and first and second network terminating nodes, first and second resistors respectively connected between the monitoring node and said first and second terminating nodes, means connecting each of said first monitoring nodes to said monitoring means, the second terminating node of each of said networks being connected to a reference node at the negative terminal of the first of said "n" modules;

the first terminating node of said "n" networks being connected to the positive terminal of respective ones of said "n" modules;

"n−1" compensating resistors respectively connecting the positive terminal of the "nth" module to the positive terminal of the remaining ones of said "n" modules;

said "n−1" compensating resistors and the resistors in said "n" networks being sized to produce equal discharge current from each module during monitoring of the voltage across the modules.

9. The invention defined in claim 8 further comprising a second bank of "m" serially connected modules each having positive and negative terminals, m being an integer greater than one, the positive terminal of the first of said "m" modules connected with the negative terminal of the first of said "n" modules;

"m" voltage divider networks each including a second monitoring node and third and fourth network terminating nodes, third and fourth resistors respectively connected between said second monitoring node and said third and fourth terminating nodes, means connecting each of said second monitoring nodes to said monitoring means, the second terminating node of each of said "m" networks being connected to said reference node to establish a reference voltage of one-half the total battery voltage;

the first terminating node of each of said "m" networks being connected to the negative terminal of respective ones of said "m" modules;

"m−1" compensating resistors respectively connecting the negative terminal of the "mth" module to the negative terminal of the remaining ones of said "m" modules;

said "m−1" compensating resistors and the resistors in said "m" networks being sized to produce equal discharge current from each module during monitoring of the voltage across the modules.

* * * * *